(12) United States Patent
Huisman

(10) Patent No.: US 11,556,068 B2
(45) Date of Patent: Jan. 17, 2023

(54) DETECTION SYSTEM FOR AN ALIGNMENT SENSOR

(71) Applicant: ASML Netherlands B.V., Veldhoven (NL)

(72) Inventor: Simon Reinald Huisman, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/284,009

(22) PCT Filed: Sep. 24, 2019

(86) PCT No.: PCT/EP2019/075677
§ 371 (c)(1),
(2) Date: Apr. 9, 2021

(87) PCT Pub. No.: WO2020/074250
PCT Pub. Date: Apr. 16, 2020

(65) Prior Publication Data
US 2021/0382404 A1 Dec. 9, 2021

(30) Foreign Application Priority Data
Oct. 12, 2018 (EP) .................... 18200138

(51) Int. Cl.
*G03F 7/20* (2006.01)
*G03F 9/00* (2006.01)
*G02B 6/02* (2006.01)

(52) U.S. Cl.
CPC ....... *G03F 9/7088* (2013.01); *G02B 6/02042* (2013.01)

(58) Field of Classification Search
CPC .. G03F 9/7088; G03F 9/7084; G03F 7/70108; G03F 9/7069; G02B 6/02042;
(Continued)

(56) References Cited

U.S. PATENT DOCUMENTS

| 5,659,642 A | 8/1997 | King et al. |
| 6,366,352 B1 | 4/2002 | Goldberg et al. |

(Continued)

FOREIGN PATENT DOCUMENTS

| JP | 2003-502634 A | 1/2003 |
| JP | 2016-519765 A | 7/2016 |

(Continued)

OTHER PUBLICATIONS

International Search Report and Written Opinion of the International Searching Authority directed to related International Patent Application No. PCT/EP2019/075677, dated Dec. 17, 2019; 8 pages.

(Continued)

*Primary Examiner* — Mesfin T Asfaw
(74) *Attorney, Agent, or Firm* — Sterne, Kessler, Goldstein & Fox P.L.L.C.

(57) ABSTRACT

A detection system for an alignment sensor, and an alignment sensor and lithographic projection apparatus comprising such a detection system is disclosed. The detection system comprises at least one detection circuit; and a plurality of optical fiber cores for transporting a measurement signal to the at least one detection circuit. At least as subset of the plurality of optical fiber cores are selectively switchable between a detection state and a non-detection state, thereby defining a configurable detection spot.

18 Claims, 4 Drawing Sheets

(58) Field of Classification Search
CPC .............. G02B 6/2804; G02B 21/0036; G02B 21/0028; G02B 6/06; G02B 21/0024; G02B 23/26; F25D 11/003; F25D 23/006; F25D 3/06; G01B 11/14; G01B 9/0207
See application file for complete search history.

(56) References Cited

U.S. PATENT DOCUMENTS

| | | | |
|---|---|---|---|
| 6,429,968 | B1 | 8/2002 | Carver |
| 6,961,116 | B2 | 11/2005 | Den Boef et al. |
| 9,733,572 | B2 | 8/2017 | Mathijssen |
| 2013/0230797 | A1 | 9/2013 | Van Der Sanden et al. |
| 2015/0355554 | A1* | 12/2015 | Mathijssen ........... G03F 9/7092 355/67 |
| 2015/0377797 | A1 | 12/2015 | Kolchin et al. |
| 2016/0077445 | A1 | 3/2016 | Den Boef et al. |
| 2017/0160075 | A1 | 6/2017 | Kreuzer et al. |

FOREIGN PATENT DOCUMENTS

| | | |
|---|---|---|
| WO | WO 2017/045874 A1 | 3/2017 |
| WO | WO 2018/114152 A1 | 6/2018 |

OTHER PUBLICATIONS

International Preliminary Report on Patentability directed to related International Patent Application No. PCT/EP2019/075677, dated Apr. 8, 2021; 6 pages.

\* cited by examiner

DETECTION SYSTEM FOR AN ALIGNMENT SENSOR

CROSS-REFERENCE TO RELATED APPLICATIONS

This application claims priority of EP application 18200138.8 which was filed on 12 Oct. 2018 and which is incorporated herein in its entirety by reference.

FIELD

The present invention relates to a method and apparatus for processing a substrate in a lithographic apparatus. In particular the present invention relates to alignment of substrates in a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to control the lithographic process to place device features accurately on the substrate, one or more alignment marks are generally provided on, for example, the substrate, and the lithographic apparatus includes one or more alignment sensors by which the position of the mark may be measured accurately. The alignment sensor may be effectively a position measuring apparatus. Different types of marks and different types of alignment sensors are known from different times and different manufacturers.

Known alignment sensors use one or several radiation sources to generate a plurality of radiation beams with different wavelengths. In this fashion, a sensor may measure position using several wavelengths (e.g., colors) and polarizations of radiation (e.g., light) on the same target grating or gratings. No single color or polarization is ideal for measuring in all situations, so the system selects from a number of signals, which one provides the most reliable position information.

As substrates become increasingly complex, with increasing numbers of patterns being applied to them, it becomes necessary to add additional wavelengths and/or polarizations in order to ensure the ability of the alignment sensor to provide reliable position information. The addition of more patterns may reduce the amount of light scattered by alignment marks on the substrate. Furthermore, some patterns may be made of materials that are opaque to the wavelengths used by the alignment sensor. To mitigate this, even more complexity must be added to the alignment system. However, given the physical constraints on the alignment sensor, since it has to fit within the lithographic apparatus, may not be feasible or desirable.

A small detection spot is needed for small footprint alignment marks. It is important not to detect light from surrounding structures, as this can lead to a misaligned position. The dilemma is that when aligning on larger footprint marks, it is desirable to have a larger detection spot than when aligning on smaller footprint marks.

SUMMARY

According to an aspect of the invention, there is provided a detection system for an alignment sensor, comprising: at least one detection circuit; and a plurality of optical fiber cores for transporting a measurement signal to the at least one detection circuit; wherein at least a subset of the plurality of optical fiber cores are selectively switchable between a detection state and a non-detection state, thereby defining a configurable detection spot According to a second aspect of the invention, there is provided an alignment sensor system comprising the detection system of the first aspect, wherein an optical input of the plurality of optical fiber cores is located at a detection plane of the alignment sensor, said optical input being operable as an effective field stop for the alignment sensor system.

According to a third aspect of the invention, there is provided a lithographic projection apparatus, comprising: a radiation system for providing a projection beam of radiation; a support structure for supporting a patterning device used to pattern the projection beam according to a desired pattern; a substrate table for holding a substrate; a projection system for projecting the patterned beam onto a target portion of the substrate; and an alignment system of the second aspect, for aligning the substrate table and/or support structure.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Before describing embodiments of the invention in detail, it is instructive to present an example environment in which embodiments of the present invention may be implemented.

Figure 1:
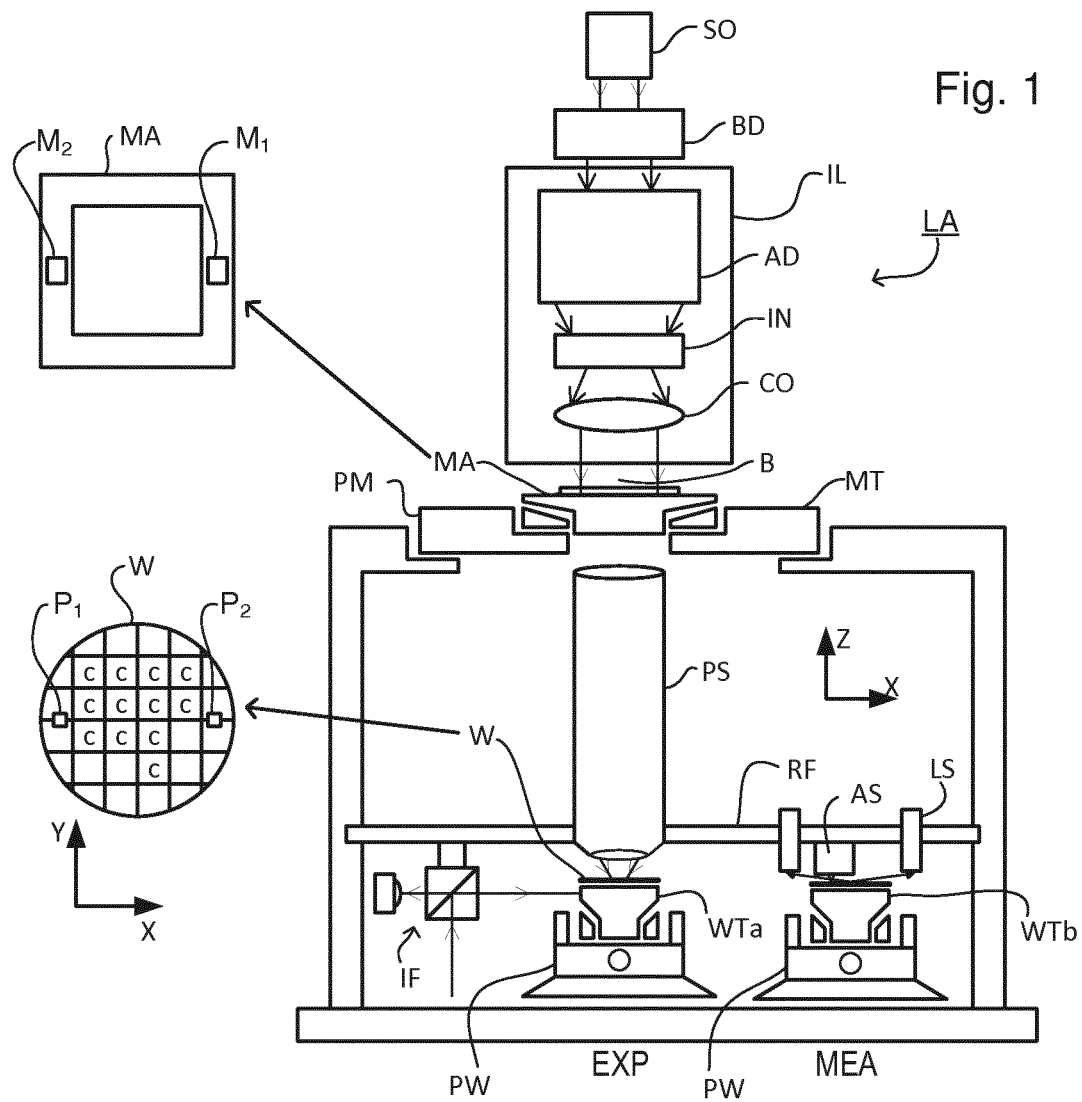
FIG. 1 depicts a lithographic apparatus including an alignment sensor.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment mark may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
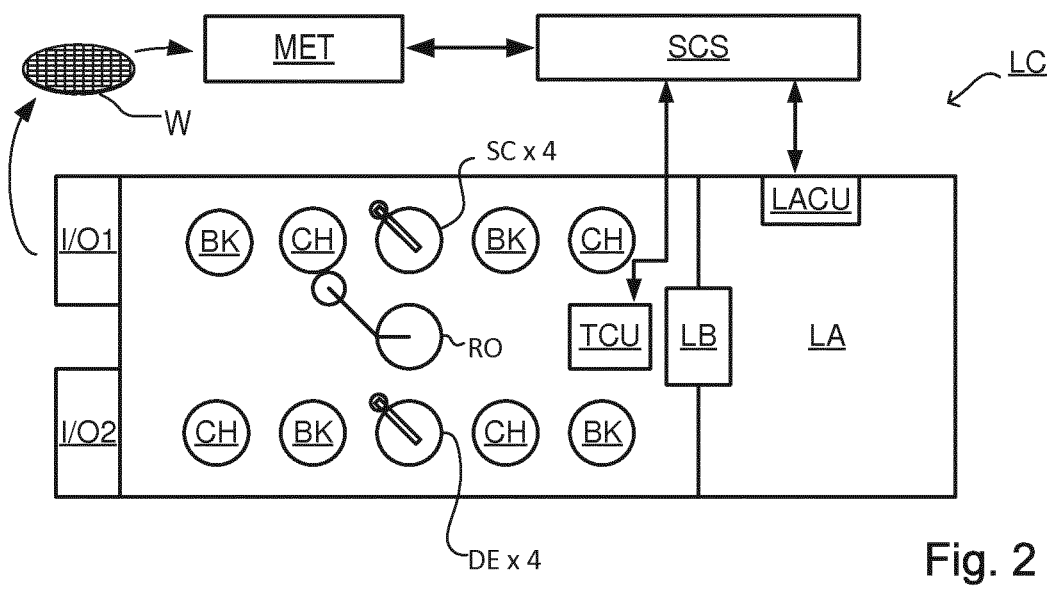
FIG. 2 depicts a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency. The substrates processed by the track are then transferred to other processing tools for etching and other chemical or physical treatments within the device manufacturing process.

The lithographic apparatus control unit LACU controls all the movements and measurements of the various actuators and sensors described. LACU also includes signal processing and data processing capacity to implement desired calculations relevant to the operation of the apparatus. In the terminology of the introduction and claims, the combination of these processing and control functions referred to simply as the "controller". In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these subsystems processing units, with operators and with other apparatuses involved in the lithographic manufacturing process.

Figure 3:
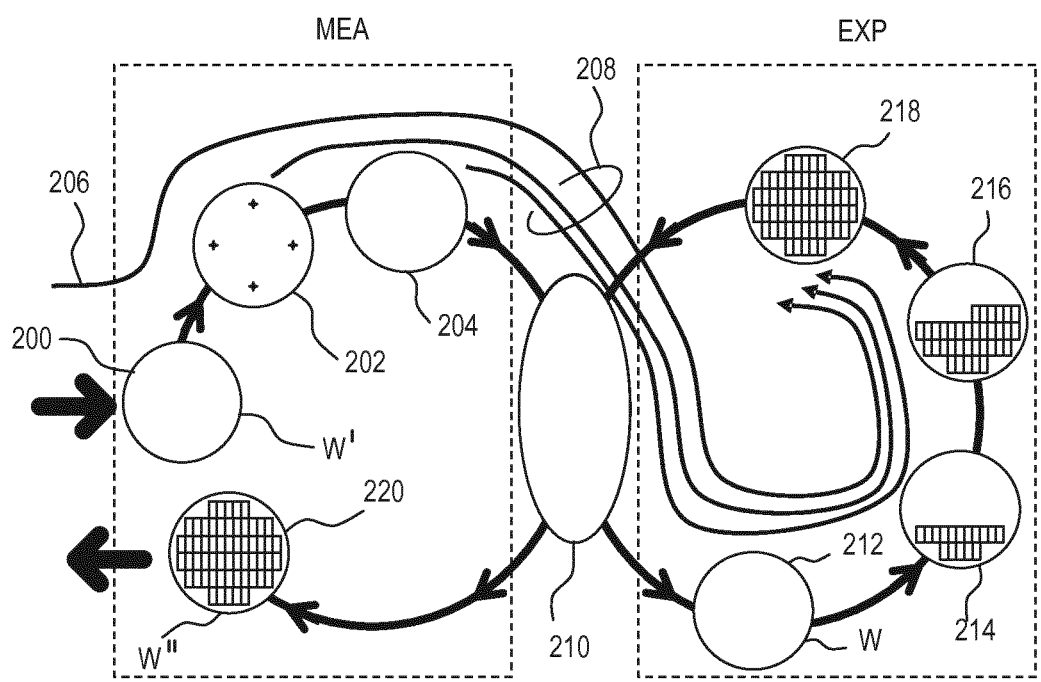
FIG. 3 illustrates the steps to expose target portions (e.g. dies) on a substrate W in the dual stage apparatus of FIG. 1.

FIG. 3 illustrates the steps to expose target portions (e.g. dies) on a substrate W in the dual stage apparatus of FIG. 1. The process according to conventional practice will be described first.

On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid", which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. As will be explained further below, the present apparatus uses height map data also to supplement the alignment measurements.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are combined and interpolated to provide parameters of an alignment model. These parameters and the alignment model will be used during the exposure operation to correct positions of patterns applied in the current lithographic step. A conventional alignment model might comprise four, five or six parameters, together defining translation, rotation and scaling of the 'ideal' grid, in different dimensions. As described further in US 2013230797A1, advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

Figure 4:
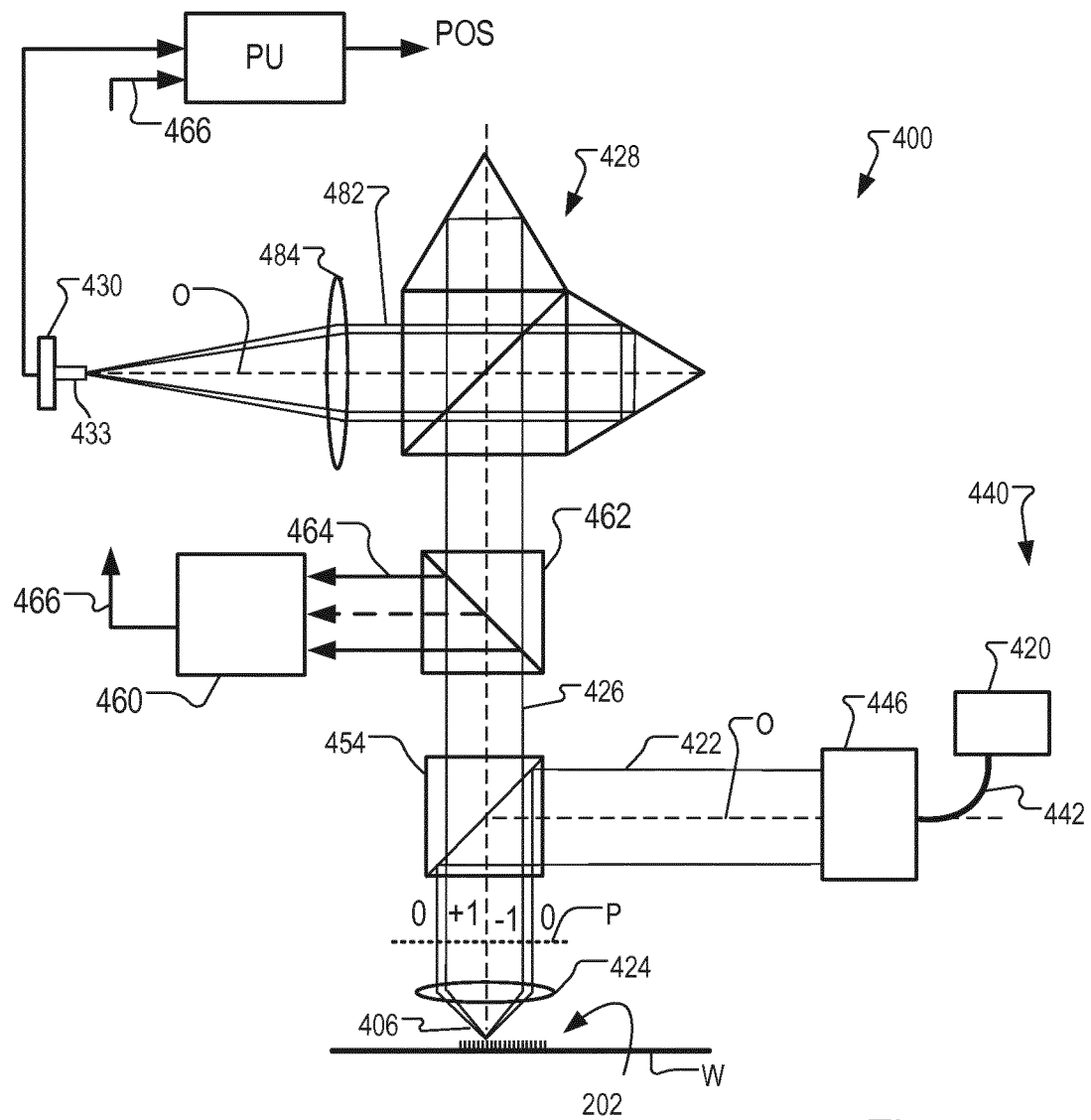
FIG. 4 illustrates an alignment sensor used in the lithographic apparatus of FIG. 1, in which an apparatus according to the present invention may be used.

FIG. 4 illustrates an optical system 400 of an alignment sensor. An optical axis O which has several branches is indicated by a broken line running throughout the optical system 400. The optical system has a radiation source 420, an illumination beam 422, an objective lens 424, an information carrying beam 426, a self-referencing interferometer 428 and a detector 430. In practice, multiple detectors may be provided. Signals from the detector are processed by processing unit PU.

Additional components illustrated in this schematic diagram are as follows. In an illumination subsystem 440, radiation from source 420 is delivered via an optical fiber 442 to an illumination profiling optic 446. This delivers input beam 422 via beam splitter 454 to objective lens 424 having a pupil plane P. Objective lens 424 forms a spot 406 on alignment mark 202 formed on substrate W. The substrate is positioned on a substrate stage (not shown), which may be moved relative to the optical system. The skilled person will, of course, realize that the relative movement can be implemented in a number of specific ways. In one example the optical system is stationary and the stage moves. In another example, the optical system moves and the stage is stationary. In yet another example, the stage moves in at least one dimension, and the optical system moves in at least one other dimension.

Information-carrying beam 426, diffracted by the mark, passes through beam splitter 454 to interferometer 428. Interferometer 428 splits the radiation field into two parts with orthogonal polarization, rotates these parts about the optical axis by 180° relative to one another, and combines them into an outgoing beam 482. A lens 484 focuses the entire field onto a detector 430 (e.g., via a multimode fiber 433). The detector 430 in this example and in the alignment sensor are effectively single photoelectric transducers (e.g., photodiodes) and do not provide any spatial information except by the scanning motion described already. In an embodiment, for example, there may be a photoelectric transducer for each wavelength used, preceded by a spectral filter to de-multiplex, or separate, the wavelengths. A detector having spatial resolution in a conjugate pupil plane can be added, to allow an angle-resolved scatterometry method to be performed using the alignment sensor hardware.

Included in the present example is an asymmetry measuring arrangement 460. Arrangement 460 receives a part 464 of the information carrying beam 426 through a second beam splitter 462 positioned in advance of the interferometer 428.

It should be noted that in the example shown in FIG. 4 some optical elements used in practice around the interferometer have been omitted. This is only done to simplify the explanation of this idea. In a real implementation they may need to be included.

At present, many alignment sensor designs rely on alignment marks which comprise a large area or footprint on the substrate, such that they can only be accommodated in a scribe lane. There is a growing demand for alignment marks which have a smaller footprint. For example, smaller alignment marks would mean that the marks could be accommodated in product areas to enable intra-field grid corrections. Alternatively, or in addition, the ability to align to smaller marks may enable alignment on already existing metrology marks, or similar, such as those used to measure overlay. An example of such an overlay mark is known as a micro-diffraction based overlay or µDBO mark. A µDBO mark may, for example, comprise four grating structures arranged in a 2×2 square, having a total area of approximately 10-16 µm$^2$ and a typical grating pitch of approximately 500-700 nm. This contrasts with typical alignment marks which (for example) may be more than five times larger (at least in one dimension). One specific type of alignment mark presently used comprises two gratings of dimensions of 80 μm×38 μm, and a typical (e.g., diagonally oriented) grating pitch greater than 1.6 μm.

While it is desirable to provide an alignment sensor which can align on much smaller marks (e.g., having much smaller pitches if using an off-axis illumination scheme as illustrated in FIG. 4), it is also desirable to achieve this with minimal change to the alignment sensor, and/or to retain backwards compatibility with the larger alignment marks typically used at present. A detection system for an alignment sensor will now be described which enables the alignment sensor to achieve these desirable characteristics.

To properly function, an alignment sensor needs to detect the pitch of an alignment mark without measuring any surrounding structures. An alignment error may result from the detected signal including any contribution from the surrounding structures. To achieve this, the detection spot (detection area) should be sufficiently small to detect only the signal from the alignment mark, without any contribution from its surroundings. One way of achieving this is to use a small illumination spot (illumination area on the mark); more specifically using an illumination spot which is smaller than the mark, such that it underfills the mark (i.e., is incident only on the mark). Alternatively a field stop (e.g., an aperture or iris) can be provided in an intermediate image plane which blocks the undesired components of the alignment signal (i.e., the signal component resultant from surrounding structures). One known type of alignment sensor (described in U.S. Pat. No. 6,961,116, which is incorporated by reference herein in its entirety), comprises a field stop in the detection plane. In other types of alignment sensor, the core diameter of the detection multimode optical fiber(s) (which transport the detected signal to the detectors) defines the detection spot, effectively acting as a field stop in the detection plane.

As such, the detection spot should be small when aligning on small alignment marks. This can be achieved, for example, by implementing a small illumination spot or a suitable field stop. However, such a small detection spot is non-optimal for larger alignment marks such as used presently, resulting on a degraded alignment performance which would effectively limit or prohibit backwards compatibility with such marks. A configurable field stop is another option (e.g., having a controllable size). However, it is highly undesirable to have moving components within the alignment sensor, as such moving parts degrade alignment performance.

Therefore, a dynamic field stop is proposed which comprises no moving parts. More specifically, the dynamic field stop may comprise a plurality of multimode fibers or fiber cores located in the detection plane (i.e., optical inputs in the detection plane) which can be selectively switched in and out of a detection state to define the detection spot. For example, a multimode, multicore fiber may be used.

Referring back to FIG. 4, it is proposed that the single core multimode fiber 433 is replaced with multiple fiber cores (e.g., a multimode, multicore fiber). These cores can be individually switched between a detection state and non-detection state. In a particular embodiment, two detection modes are envisaged, a first detection mode for aligning on small alignment marks and a second detection mode for aligning on large alignment marks. In each case, it is proposed that different sets of fiber cores are switched into a detection state; more specifically, a larger subset of fiber cores are switched into a detection state for the second detection mode than for the first detection mode, thereby effectively defining a larger detection spot for the second detection mode.

In an embodiment the first detection mode may comprise only the first subset of fiber cores being switched into a detection state, with the remaining fiber cores in a non-detection state. In an embodiment, the first subset may comprise only a single fiber core. The second detection mode may comprise a second subset being switched into the detection state, the second subset including the first subset (thereby effectively increasing the detection spot). In an embodiment, the second detection mode comprises using all the fiber cores (i.e., including those of the first subset) such that all the fiber cores of the multicore fiber are in the detection state. It may be, in an embodiment, that the one or more fiber cores of the first subset is always in the detection state, with only those fiber cores in the second subset, but not in the first subset, being selectively switchable between detection and non-detection states. This is because, in an embodiment, it is envisaged that the second subset of fiber cores will always include the first subset of fiber cores.

It can be appreciated that more than two detection modes are possible (e.g., for alignment on three or more different types/sizes of alignment mark). For example, a third detection mode (e.g., for alignment marks having a size intermediate the small alignment marks and large alignment marks described above) can be defined which uses a third subset of fiber cores which is larger than the first subset, but smaller than the second subset.

Figure 5A:
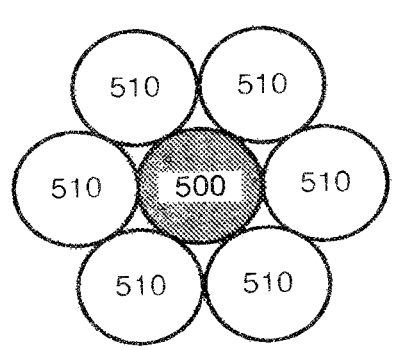
FIGS. 5(*a*)-5(*c*) illustrates three alternative multiple core, multimode fiber arrangements providing an effective configurable detection spot according to an embodiment of the invention.
Figure 5B:
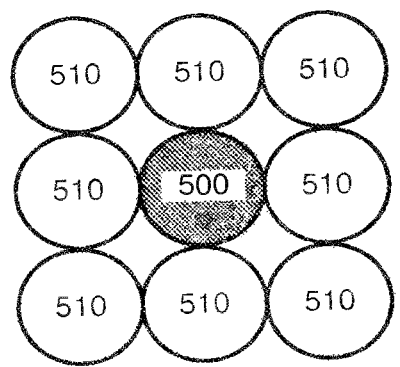
Figure 5C:
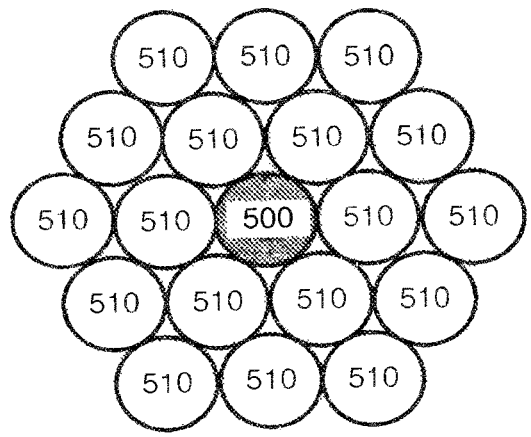

FIG. 5 shows a cross-section, in the detection plane, of three different multimode, multicore fiber arrangements for transporting a measurement signal to detection circuitry. These are purely exemplary, and it will be appreciated that the number of different arrangements and permutations are numerous. In each of the examples of FIGS. 5(a)-5(c), the first subset comprises only a single fiber core, more specifically the central fiber core 500, thereby defining a smaller diameter detection spot, and the second subset comprises all of the fiber cores 500, 510, thus defining a larger diameter detection spot. Again, this is purely exemplary and the subsets may differ from comprising either one core or all cores. Note that the central fiber core is shown shaded only to help illustrate the two resultant detection spot sizes, the fiber cores 500, 510 are all essentially the same.

FIG. 5(a) shows an arrangement with seven fiber cores (e.g., forming part of a single multicore fiber). FIG. 5(b) shows that the fiber cores need not necessarily be arranged to mimic a circular spot (e.g., by being arranged hexagonally). In this example, the fiber cores 500, 510 of the second subset in this embodiment are arranged to form a square detection spot, while as before the first subset comprises only the central fiber core 500. FIG. 5(c) shows a second hexagonal arrangement where the second subset 500, 510 is larger (e.g., comprises more than one layer of surrounding cores) with respect to the first subset 500, compared to the arrangement of FIG. 5(a).

In an embodiment, each fiber core 500, 510 may be separately connected to a detection circuit (e.g., optical analog to digital board OADB), each detection circuit comprising a photoelectric transducer (e.g., photodiode or similar device) and associated (e.g., amplification) circuitry. Where multiple wavelength radiation is used, a spectral filter/de-multiplexer may be provided, with each wavelength detected by a separate detection circuit. As such, this may result in scalability issues when a larger number of fiber cores are used. Therefore, in an embodiment, some of the fiber cores may be grouped together, such that their outputs are combined into, for example, a single larger diameter multimode fiber. The output of the single larger diameter multimode fiber can then be coupled to a single detection circuit. The single detection circuit may have a single photoelectric transducer (for a single wavelength sensor), or a photoelectric transducer per wavelength. More specifically, there may be provided only one detection circuit per detection mode.

Figure 6:
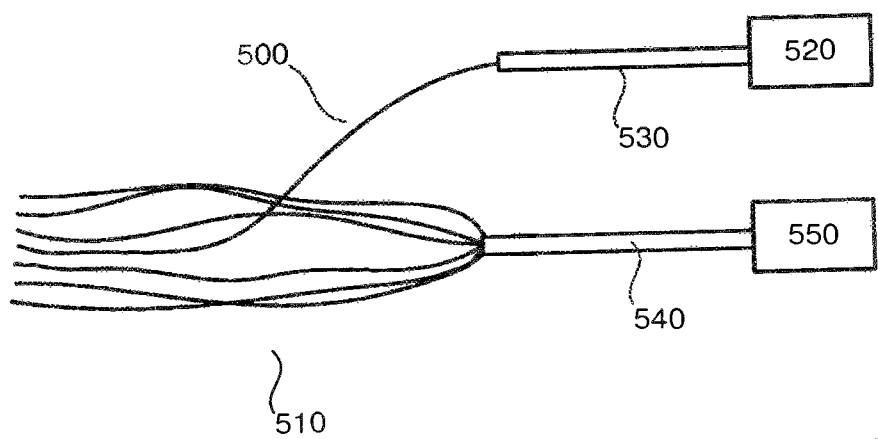
FIG. 6 illustrates a detection arrangement according to an embodiment of the invention.

FIG. 6 illustrates such an example. In this example, the first subset (e.g., central fiber core) 500 is connected to a first detection circuit 520, for example via a multimode fiber 530 (as shown) or directly, while all the other fiber cores 510 have their combined outputs fed into a (e.g., larger diameter) multimode fiber 540, which is connected to a second detection circuit 550. In such an embodiment, in a first detection mode, only the central fiber core 500 will be switched into a detection state, e.g., by having only the first detection circuit 520 operational. In a second detection mode, all fiber cores 500, 510 are switched into a detection state e.g., by having both the first detection circuit 520 and second detection circuit 550 operational. Both the first detection circuit 520 and second detection circuit 550 may comprise a single photoelectric transducer, or (where the alignment sensor measures using multiple wavelengths or bands), a spectral filter/de-multiplexer and single photoelectric transducer per wavelength/band.

In an embodiment, the disclosed proposal may provide for the possibility to perform in-mark corrections, more specifically when aligning to larger marks in the second detection mode. In the second detection mode, the different fiber cores each detect different sub-regions of the mark, thereby enabling (low-resolution) in-mark-corrections based on a comparison of the imaged sub-regions (e.g., depending on the size/number of fiber cores of the multiple core multimode fiber). This might also be possible in the first detection mode where the first subset comprises more than one fiber core. Alternatively, or in addition, at least one of the (e.g., outer) fiber cores could be used for automatic gain control. During a measurement, the outer fiber cores will detect the mark first, i.e., before the mark is 'seen' by the inner fiber core(s). Therefore, the signal strength detected by one (or more) of the outer fiber cores can be used to set the gain setting for detection by the other (e.g., inner) fiber core(s).

Therefore, a detection system comprising a configurable detection spot (area) is disclosed for an alignment sensor, which is backward compatible with existing single pixel alignment sensors (camera/CCD based sensors can simply isolate a region of interest on the sensor), and which enables more optimal detection on alignment marks of very different areas/footprints and pitches while rejecting influence from surrounding structures. The proposal does not introduce any moving parts to the alignment sensor and can be implemented with very little change to the presently used sensor hardware, the only changes being the substitution of a multiple core multimode fiber in place of the single core multimode fiber presently used, and at least one additional detection circuit.

It will of course be appreciated that the specific implementation of the detection system described above is exemplary only, and that other implementations of the detection system may be envisaged.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A detection system for an alignment sensor, comprising:
   at least one detection circuit; and
   a plurality of optical fiber cores configured to transport a measurement signal to the at least one detection circuit;
   wherein at least a subset of the plurality of optical fiber cores are selectively switchable between a detection state and a non-detection state, thereby defining a configurable detection spot, and
   wherein the detection system is operable in a first detection mode wherein only a first subset of the plurality of optical fiber cores are in a detection state, and a second detection mode wherein only a second subset of the plurality of optical fiber cores are in a detection state, the first subset being smaller than the second subset, thereby defining a smaller detection spot in the first detection mode than in the second detection mode.

2. The detection system of claim 1, wherein the plurality of optical fiber cores are bundled together to define an optical input for receiving the measurement signal.

3. The detection system of claim 1, wherein the plurality of optical fiber cores comprise a multicore, multimode optical fiber.

4. The detection system of claim 1, wherein the second subset comprises the first subset.

5. The detection system of claim 1, wherein the first subset is located approximately centrally with respect to the second subset.

6. The detection system of claim 1, wherein the first subset comprises a single fiber core.

7. The detection system of claim 1, wherein the second subset comprises a majority of the plurality of fiber cores.

8. The detection system of claim 1, wherein the first subset of optical fiber cores is optically coupled to a first detection circuit, and the second subset of optical fiber cores that are not part of the first subset is optically coupled to a second detection circuit.

9. The detection system of claim 8, wherein, for each of the first subset and the second subset of optical fiber cores that comprise the plurality of optical fiber cores, the plurality of optical fiber cores are optically coupled to its respective detection circuit via a single, larger diameter, optical fiber core.

10. The detection system of claim 8, wherein each of the first and the second detection circuits comprises a single photoelectric transducer for each wavelength and/or wavelength band detected by the detection system.

11. The detection system of claim 10, wherein the detection system is operable to measure a plurality of wavelengths and/or wavelength bands, and each of the detection circuits comprises a spectral filter between the optical fiber cores and the photoelectric transducers, to separate the plurality of wavelengths and/or wavelength bands.

12. The detection system of claim 1, being additionally operable in at least a third detection mode wherein only a third subset of the plurality of optical fiber cores are in a detection state, the third subset of optical fiber cores being larger than the first subset, but smaller than the second subset.

13. The detection system of claim 1, wherein at least one of optical fiber cores, outside of the first subset, is operable to be used for gain control for signals detected by at least one of the other optical fiber cores.

14. The detection system of claim 1, wherein the detection system comprises a processor configured to process the measurement signal, the processor also being operable to control switching between detection states for the fiber cores, and therefore control switching between detection modes.

15. The detection system of claim 4, wherein a processor is operable to perform corrections for an alignment mark being measured, based on a consideration of different sub regions of the alignment mark that are detected by individual optical fiber cores of the corresponding subset of optical fiber cores.

16. An alignment sensor system comprising the detection system of claim 1, wherein an optical input of the plurality of optical fiber cores is located at a detection plane of the alignment sensor, the optical input being operable as an effective field stop for the alignment sensor system.

17. The alignment sensor system of claim 16, comprising a self-referencing interferometer for projecting two overlapping images of an alignment mark that are relatively rotated by 180°, wherein the detection system is operable to detect light intensities at a plurality of different positions in a pupil plane of the self-referencing interferometer.

18. A lithographic projection apparatus, comprising:
a radiation system for providing a projection beam of radiation;
a support structure for supporting a patterning device used to pattern the projection beam according to a desired pattern;
a substrate table for holding a substrate;
a projection system for projecting the patterned beam onto a target portion of the substrate; and
an alignment system of claim 17, for aligning the substrate table and/or support structure.

* * * * *